(12) United States Patent
Shimazawa et al.

(10) Patent No.: US 6,294,911 B1
(45) Date of Patent: Sep. 25, 2001

(54) MEASUREMENT METHOD OF MAGNETIZATION DIRECTION OF MAGNETORESISTIVE EFFECT DEVICES AND MEASUREMENT APPARATUS BASED ON THE METHOD OF TDK CORPORATION

(75) Inventors: Koji Shimazawa; Nozomu Hachisuka; Manabu Ohta; Tetsuro Sasaki; Satoru Araki, all of Tokyo (JP)

(73) Assignee: TDK Corporation, Tokyo (JP)

(*) Notice: Subject to any disclaimer, the term of this patent is extended or adjusted under 35 U.S.C. 154(b) by 0 days.

(21) Appl. No.: 09/263,778

(22) Filed: Mar. 5, 1999

(30) Foreign Application Priority Data

Mar. 12, 1998 (JP) .................................. 10-078550

(51) Int. Cl.7 .................................................. G01R 33/09
(52) U.S. Cl. ............................ 324/210; 324/246; 324/252
(58) Field of Search .................................... 324/210, 223, 324/246, 249, 252

(56) References Cited

U.S. PATENT DOCUMENTS 5,206,590   4/1993  Dieny et al. .......................... 324/252
5,422,571   6/1995  Gurney et al. ........................ 324/252
5,998,993 * 12/1999  Inage et al. .......................... 324/210

OTHER PUBLICATIONS

"A Study of a Control Method for the Pinning Direction of Spin Valve Films", Nagasaka et al, *Summary of the 21th Science Lecture of Japan Applied Magnetics Society*, 1997, p. 419.

* cited by examiner

*Primary Examiner*—Hezron Williams
*Assistant Examiner*—Henry S. Andersen
(74) *Attorney, Agent, or Firm*—Arent Fox Kintner Plotkin & Kahn, PLLC

(57) ABSTRACT

A method of measuring magnetization direction of a MR device, includes a first step of obtaining both maximum electrical resistance values under positive and negative applied measurement magnetic fields onto the MR device biased by anti-ferromagnetic material, a second step of relatively rotating a basic axis of the MR device against a direction of the applied measurement magnetic field until both the maximum resistance values become comparatively the same, and a third step of obtaining a relative rotation angle between the basic axis of the MR device and the direction of the applied measurement magnetic field.

12 Claims, 11 Drawing Sheets

MEASUREMENT METHOD OF MAGNETIZATION DIRECTION OF MAGNETORESISTIVE EFFECT DEVICES AND MEASUREMENT APPARATUS BASED ON THE METHOD OF TDK CORPORATION

FIELD OF THE INVENTION

The present invention relates to a method of measuring magnetization direction of magnetoresistive effect (MR) devices biased by anti-ferromagnetic material layer and to a measuring apparatus based on such method especially for giant magnetoresistive effect (GMR) devices such as spin valve effect MR devices, and tunneling magnetoresistive effect (TMR) devices which are applied to hard disk drive (HDD) units as read sensors.

DESCRIPTION OF THE RELATED ART

Recently, MR thin film read sensors based on spin valve effect of GMR characteristics are proposed (United States Pat. Nos. 5,206,590 and 5,422,571) in order to satisfy the requirement for ever increasing data storage densities in today's magnetic storage systems like hard disk drive units. The spin valve effect thin film structure includes first and second thin film layers of a ferromagnetic material separated by a thin film layer of non-magnetic conductive material, and an adjacent layer of anti-ferromagnetic material is formed in physical contact with the second ferromagnetic layer to provide exchange bias magnetic field by exchange coupling at the interface of the layers. The magnetization direction in the second ferromagnetic layer is constrained or maintained by the exchange coupling, hereinafter the second layer is called "pinned" layer. On the other hand, the magnetization direction of the first ferromagnetic layer is free to rotate in response to an externally applied measurement magnetic field, hereinafter the first layer is called "free" layer. The direction of the magnetization in the free layer changes between parallel and anti-parallel against the direction of the magnetization in the pinned layer, and hence the magnetoresistive effect greatly changes and GMR characteristics are obtained.

The output characteristic of the spin valve MR read sensor depends upon the angular difference of magnetization between the free and pinned layers. The direction of the magnetization of the free layer is free to rotate in accordance with an external magnetic field. That of the pinned layer is fixed to a specific direction by the exchange coupling between the layer and adjacently formed anti-ferromagnetic layer.

In this kind of spin valve effect MR read sensor structure, the direction of the magnetization of the pinned layer may change in some cases by various reasons. If the direction of the magnetization changes, the angular difference between the pinned and free layers changes too. The output characteristic also changes. Consequently stabilizing the direction of the magnetization in the pinned layer is very important.

In order to stabilize the direction of the magnetization by the strong exchange coupling between the pinned and anti-ferromagnetic layers, a process of temperature annealing under an external magnetic field with a specific direction (pin annealing) is implemented. The pin annealing is done as follows, first the temperature is elevated up to the Neel point at which temperature magnetization order in the anti-ferromagnetic material layer will be destroyed, and then cooled down to room temperature under a certain magnetic field strength with a specific direction for the exchange coupling. By this pin anneal process, the exchange coupling is regulated at the interface of the pinned and anti-ferromagnetic layers toward the direction of the externally applied magnetic field.

However, the MR characteristics may be changed under actual high temperature operation of a hard disk drive unit, even if the pin anneal processing is properly implemented. This degradation is caused by the high temperature stress during operation of the hard disk drive unit and by the magnetic field by a hard magnet layer used for giving a bias magnetic field to the free layer.

The detail of this degradation is as follows. The direction of the magnetization in the pinned layer is different from that of the magnetic field (Hhm) by the hard magnet. And hence the direction of the magnetization of pinned layer which is contacted with the anti-ferromagnetic layer is slightly rotated toward the direction of Hbm (hereinafter the direction of the magnetization of the pinned layer is expressed as θp). In the anti-ferromagnetic material layer the Neel point temperature differs from location to location inside the layer from macroscopic point of view, and it is distributed in a certain range of temperature. Even if the temperature is less than the "bulk" Neel point (average Neel point), there could be small area whose micro Neel point temperature is low and where the exchange coupling with the pinned layer disappears. When such spin valve effect MR read sensor is operated at a high temperature T, which is less than the blocking temperature at which the exchange couplings of all microscopic area disappear and then cooled down to usual room temperature, some microscopic areas whose Neel temperatures are less than T is effectively annealed and the direction of the magnetization is rotated to θp. The total amount of the θp and the rotated amount component will change the exchange coupling state between the anti-ferromagnetic layer and the adjacent ferromagnetic layer to determine the new pinned direction of the magnetization of the magnetic structure. The new pinned direction will vary depending upon the period of time kept at high temperature because the magnetic characteristics of the ferromagnetic layer is changing over with time under the high temperature.

As stated in the above paragraph, usage of such spin valve effect MR read sensor at high temperature may cause a change of the pinned direction of the magnetization in the pinned layer, and the electrical output characteristics of the sensor are degraded in signal levels, and waveform symmetry.

In order to prevent the above-mentioned problems from occurring, it had been desired that material having a high blocking temperature and possible to provide smaller Neel temperature distribution is used for the anti-ferromagnetic layer.

As stated in the above paragraphs of the background explanation, it is very important to investigate how the thermal stability of the magnetization direction of the pinned layer depends upon the applied magnetic materials and annealing process conditions in the material development phase of MR devices, and hence a method of precise measurement of the magnetization direction of the pinned layer is required. And also the data of the magnetization direction of the pinned layer is important for device evaluation and qualification in device manufacturing. Therefore, it is very necessary to measure the magnetization direction precisely and quickly.

However, there has been no well-established way to measure the magnetization direction of the pinned layer of GMR devices such as spin valve effect MR devices and of TMR devices with good accuracy.

SUMMARY OF THE INVENTION

It is therefore an object of the present invention is to provide a method and apparatus for measuring magnetization direction of a pinned layer of a MR device biased by anti-ferromagnetic material.

According to the present invention, a method of measuring magnetization direction of a MR device, includes a first step of obtaining both maximum electrical resistance values under positive and negative applied measurement magnetic fields onto the MR device biased by anti-ferromagnetic material, a second step of relatively rotating a basic axis of the MR device against a direction of the applied measurement magnetic field until both the maximum resistance values become comparatively the same within ±1% error, and a third step of obtaining a relative rotation angle between the basic axis of the MR device and the direction of the applied measurement magnetic field.

The magnetization direction of the pinned layer of a MR device biased by anti-ferromagnetic material like a spin valve effect MR read sensor device is determined by measuring the relative rotation angle between the basic axis of the MR device and the direction of applied magnetic field which is rotated until both the maximum electrical resistance values under positive and negative externally applied measurement magnetic field onto a MR device become almost the same. This method is based on next relation expressed by the equation, $R=(1-\cos\theta p)/2$, where R is the electrical resistance of the spin valve effect MR device and $\theta p$ is the angle between the magnetization direction of the pinned layer and that of the free layer. The present invention uses the principle of $\rho$-H loop characteristic which becomes symmetrical when there is no change in pinned direction and becomes unsymmetrical when definite change in the direction.

It is preferred that the first step includes a step of measuring $\rho$-H loop of the MR device and a step of obtaining both the maximum electrical resistance values under positive and negative applied measurement magnetic fields onto the MR device depending upon the measured $\rho$-H loop.

It is also preferred that the second step includes a step of relatively rotating the basic axis of the MR device against the direction of the applied measurement magnetic field by specified degrees toward a direction in which the absolute difference between the maximum electrical resistance value Rmp under the positive applied measurement magnetic field and another maximum electrical resistance value Rmn under the negative applied measurement magnetic field decreases, and a step of obtaining the maximum values of Rmp and Rmn after the rotation.

It is preferred that the second step further includes a step of detecting the direction of the rotation for deceasing the absolute difference between the maximum values Rmp and Rmn.

Preferably, the third step includes a step of detecting the polarity of the magnetization direction of the MR device against the direction of the applied measurement magnetic field, and a step of adding +90 degrees or −90 degrees depending upon the result of the polarity.

In this case, it is preferred that expressing the positive direction of the externally applied measurement magnetic field against the basic axis of the MR device by $\theta$ini, the relative rotation angle obtained by the second step by $\theta$a, the added angle of +90 degrees or −90 degrees depending upon the result of the polarity by $\theta$b, then the magnetization direction $\theta$pin is given by an equation of $\theta pin=\theta ini+\theta a+\theta b$.

It is also preferred that the method further includes a step of judging whether the maximum electrical resistance value of the MR device exists in both the positive and negative direction of the applied measurement magnetic fields or not, and a step of relatively rotating the basic axis of the MR device against the direction of the applied measurement field by 90 degrees when the maximum values are not observed.

According to the present invention furthermore an apparatus for measuring magnetization direction of a MR device, includes a maximum value detection unit for obtaining both maximum electrical resistance values under positive and negative applied measurement magnetic fields onto the MR device biased by anti-ferromagnetic material, a rotation control unit for relatively rotating a basic axis of the MR device against a direction of the applied measurement magnetic field until both the maximum resistance values become comparatively the same, and an angle detection unit for obtaining a relative rotation angle between the basic axis of the MR device and the direction of the applied measurement magnetic field.

It is preferred that the maximum value detection unit includes a unit for measuring $\rho$-H loop of the MR device and a unit for obtaining both the maximum electrical resistance values under positive and negative applied measurement magnetic fields onto the MR device depending upon the measured $\rho$-H loop.

It is also preferred that the rotation control unit includes a unit for relatively rotating the basic axis of the MR device against the direction of the applied measurement magnetic field by specified degrees toward a direction in which the absolute difference between the maximum electrical resistance value Rmp under the positive applied measurement magnetic field and another maximum electrical resistance value Rmn under the negative applied negative applied measurement magnetic field decreases, and a unit for obtaining the maximum values of Rmp and Rmn after the rotation.

It is preferred that the rotation control unit further includes a unit for detecting the direction of the rotation for decreasing the absolute difference between the maximum values Rmp and Rmn.

Preferably, the angle detection unit includes a unit for detecting the polarity of the magnetization direction of the MR device against the direction of the applied measurement magnetic field, and a unit for adding +90 degrees or −90 degrees depending upon the result of the polarity.

In this case, it is preferred that expressing the positive direction of the externally applied measurement magnetic field against the basic axis of the MR device by $\theta$ini, the relative rotation angle obtained by the second step by $\theta$a, the added angle of +90 degrees or −90 degrees depending upon the result of the polarity by $\theta$b, then the magnetization direction $\theta$pin is given by an equation of $\theta pin=\theta ini+\theta a+\theta b$.

It is preferred that the apparatus further includes a unit for judging whether the maximum electrical resistance value of the MR device exists in both the positive and negative direction of the applied measurement magnetic fields or not, and a unit for relatively rotating the basic axis of the MR device against the direction of the applied measurement field by 90 degrees when the maximum values are not observed.

Further objects and advantages of the present invention will be apparent from the following description of the preferred embodiments of the invention as illustrated in the accompanying drawings.

DETAILED DESCRIPTION OF THE PREFERRED EMBODIMENTS

Figure 1:
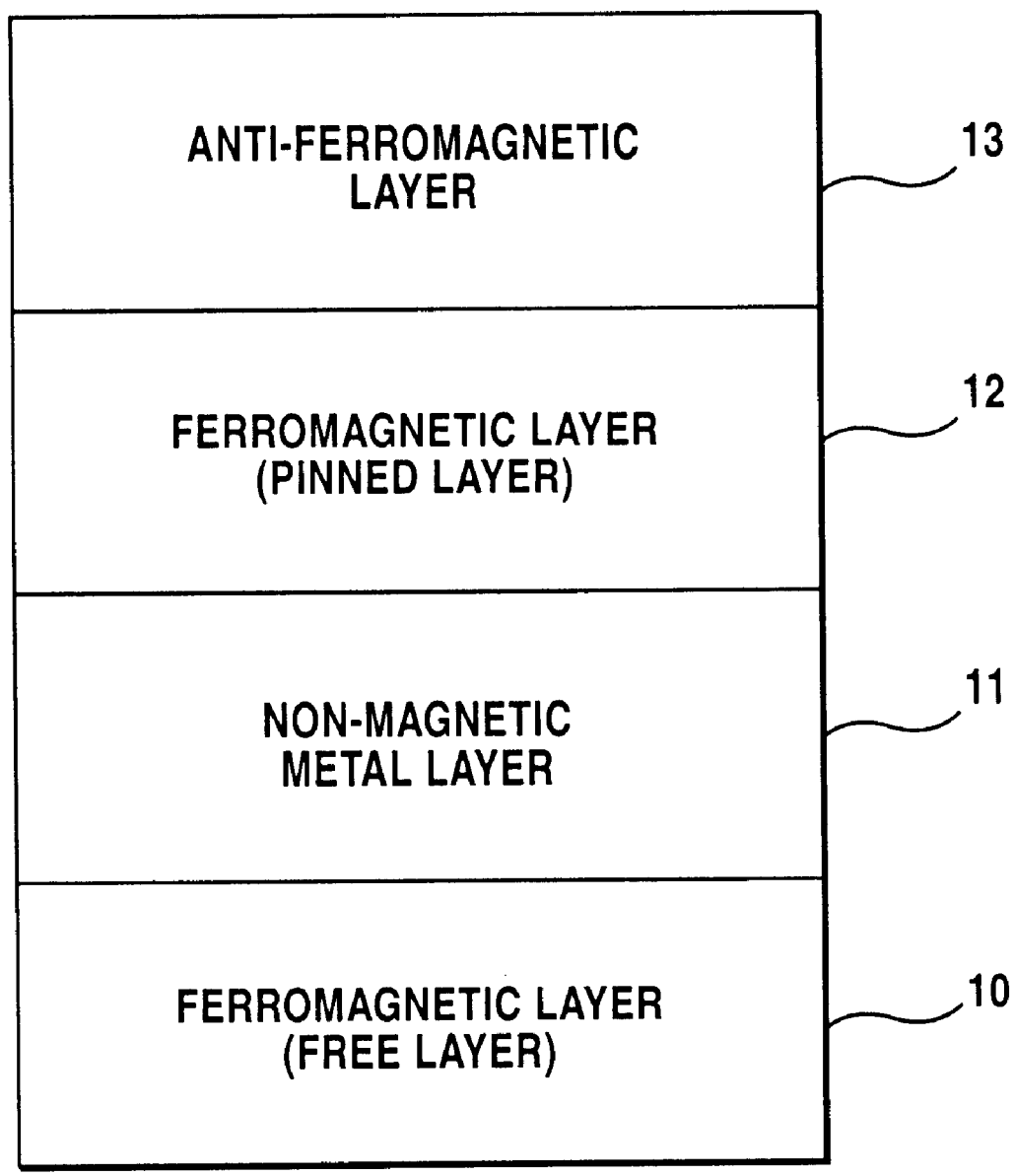
FIG. 1 shows a cross sectional view of stacked thin film layers of a spin valve effect MR read sensor.

In FIG. 1 which illustrates stacked thin film layers of a spin valve effect MR read sensor, reference number 10 and 12 are first and second ferromagnetic thin film layers respectively which are separated by a thin film layer 11 of a non-magnetic electrically conductive metallic material. On the second ferromagnetic thin film layer 12, a thin film layer 13 of anti-ferromagnetic material is stacked, and a magnetic field generated by the exchange coupling at the interface of the thin film layers 12 and 13 magnetizes the ferromagnetic layer 12, and so to speak the layer is pinned. The first ferromagnetic thin film layer 10 is a free layer in which there is no effect of exchange coupling and hence the magnetization is free to rotate in response to an externally applied magnetic field.

Figure 2:
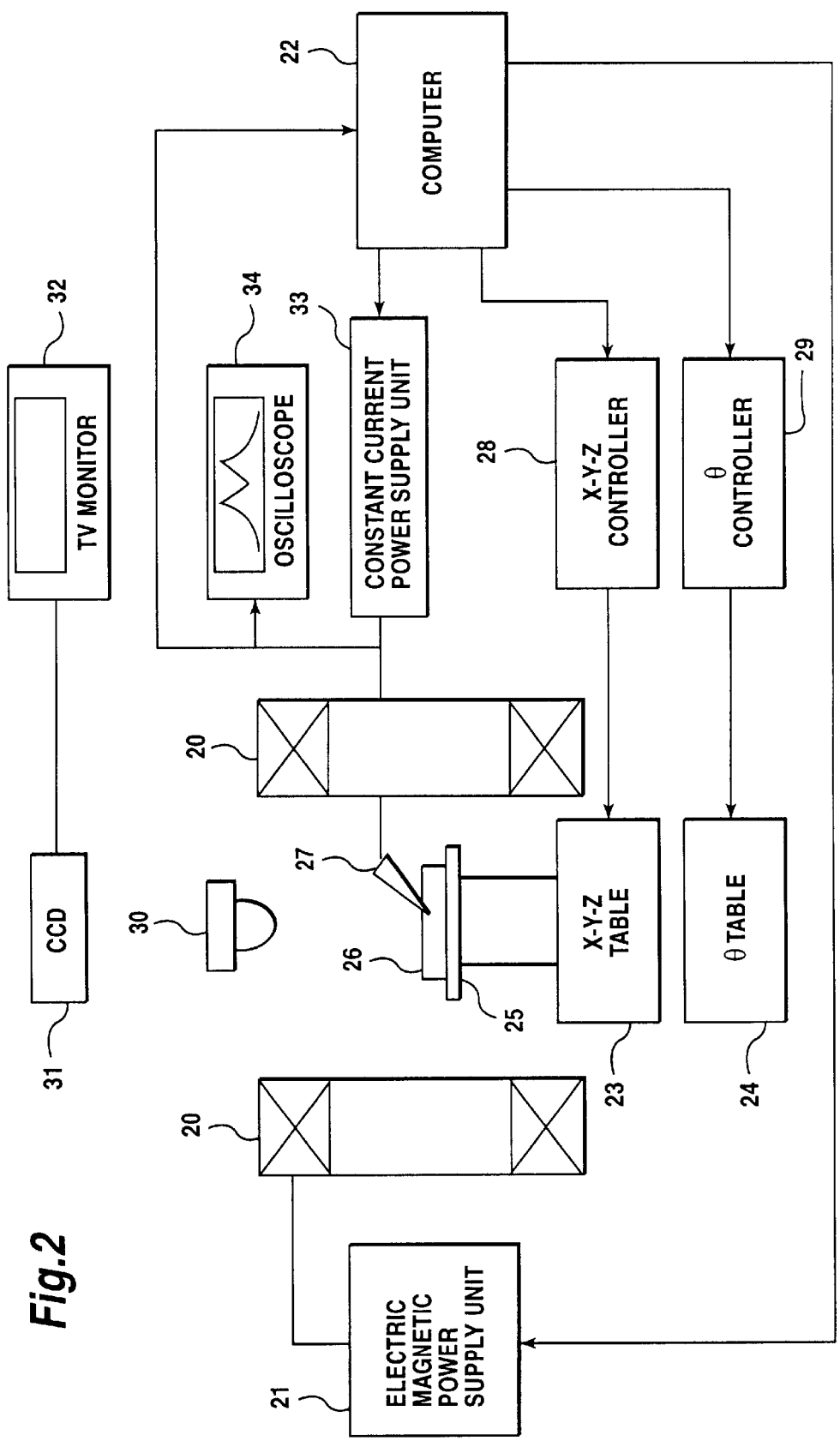
FIG. 2 shows a block diagram of the measurement apparatus to determine the magnetization direction of the pinned layer of a spin valve stacked thin film structure of a MR device by said structure according to the present invention.

FIG. 2 illustrates the measurement apparatus to determine the magnetization direction of the pinned layer of a spin valve stacked structure and MR device by the structure according to the present invention.

In FIG. 2, reference number 20 is an electric magnet without core, Helmholtz coil, to generate measurement magnetic field applied onto a spin valve stacked thin film structure to measure the magnetization direction of pinned layer, and it is placed so that the longitudinal axis is in parallel with the horizon. This electric magnet 20 Is electrically connected with a power supply unit 21 that is controlled by the commands from a computer 22. Inside the electric magnet 20, there is a platform 25 which is placed on a X-Y-Z table 23 and θ table (turn table) 24 under the table 23. On the platform 25, a wafer 26 with many of spin valve stacked thin film structures for measurement of magnetization direction of their pinned layers is placed.

When measuring the magnetization direction of another sample, (for example, a wafer on which spin valve effect MR read sensors are finished but no write elements are stacked yet, a head block cut from the wafer into bar shaped block to have aligned MR head devices and there after received the gap depth processing, or a MR head device individually separated from the head block) this sample is placed on the platform 25 instead of the wafer 26.

A probe pins assembly 27 is placed by a fixture to make electrical contact with the output pads of the MR head device, the probe pins assembly 27 and the output pads are aligned by the X-Y-Z table 23 and its X-Y-Z table controller 28, and by the θ table (turn table) 24 and its θ table controller 29. The alignment of the probe pins assembly 27 and the output pads on the sample 26 can be monitored by a TV monitor display 32 which shows the image captured by a Charge coupled device (CCD) image sensor 31 through an optical device 30.

A constant current power supply unit 33 is electrically connected with the probe pins assembly 27 to supply sense current to the spin valve stacked thin film structure. And also the probe pins assembly 27 is electrically connected with an oscilloscope 34 to display the output voltage of the spin valve stacked thin film structure and with the computer 22 which executes A/D conversion of the output voltage and data analysis.

The electric magnet power supply unit 21, the X-Y-Z table controller 28, the θ table controller 29 and the constant current power supply 33 are connected with the computer 22, and controlled under commands from the computer 22.

Figure 3A:
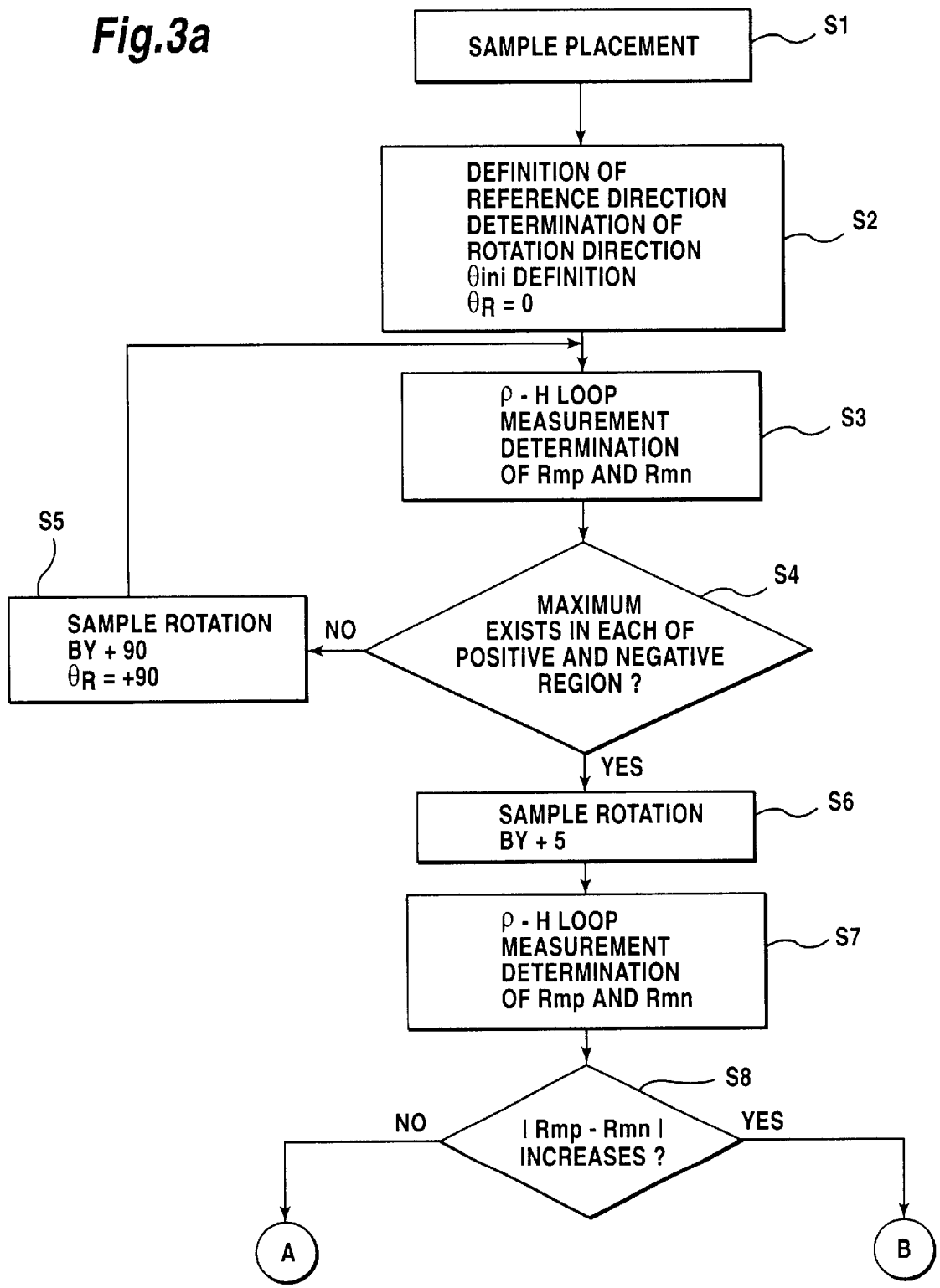
FIGS. 3a to 3c show flow charts of parts of the computer program in an embodiment of the present invention in FIG. 2.
Figure 3B:
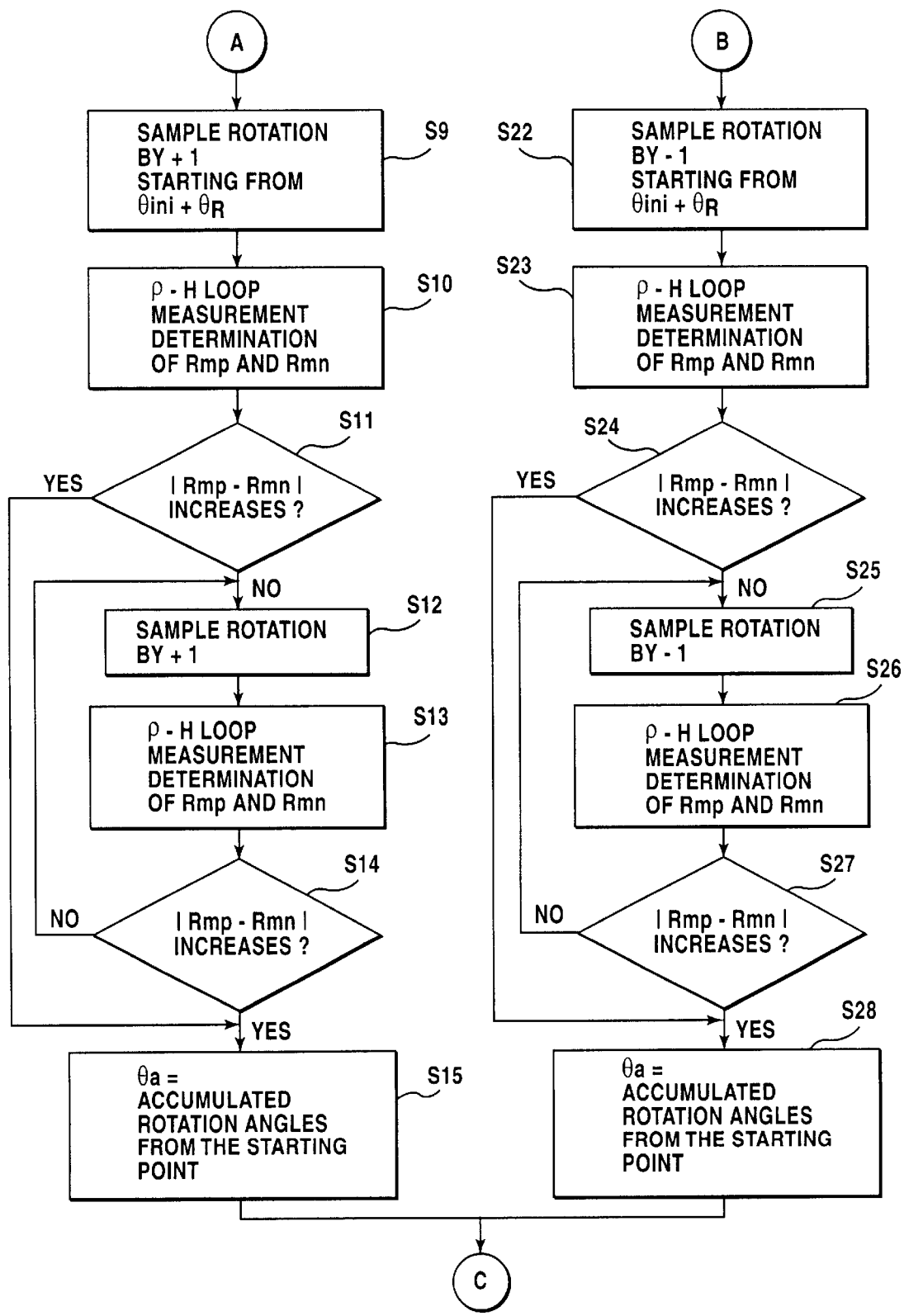
Figure 3C:
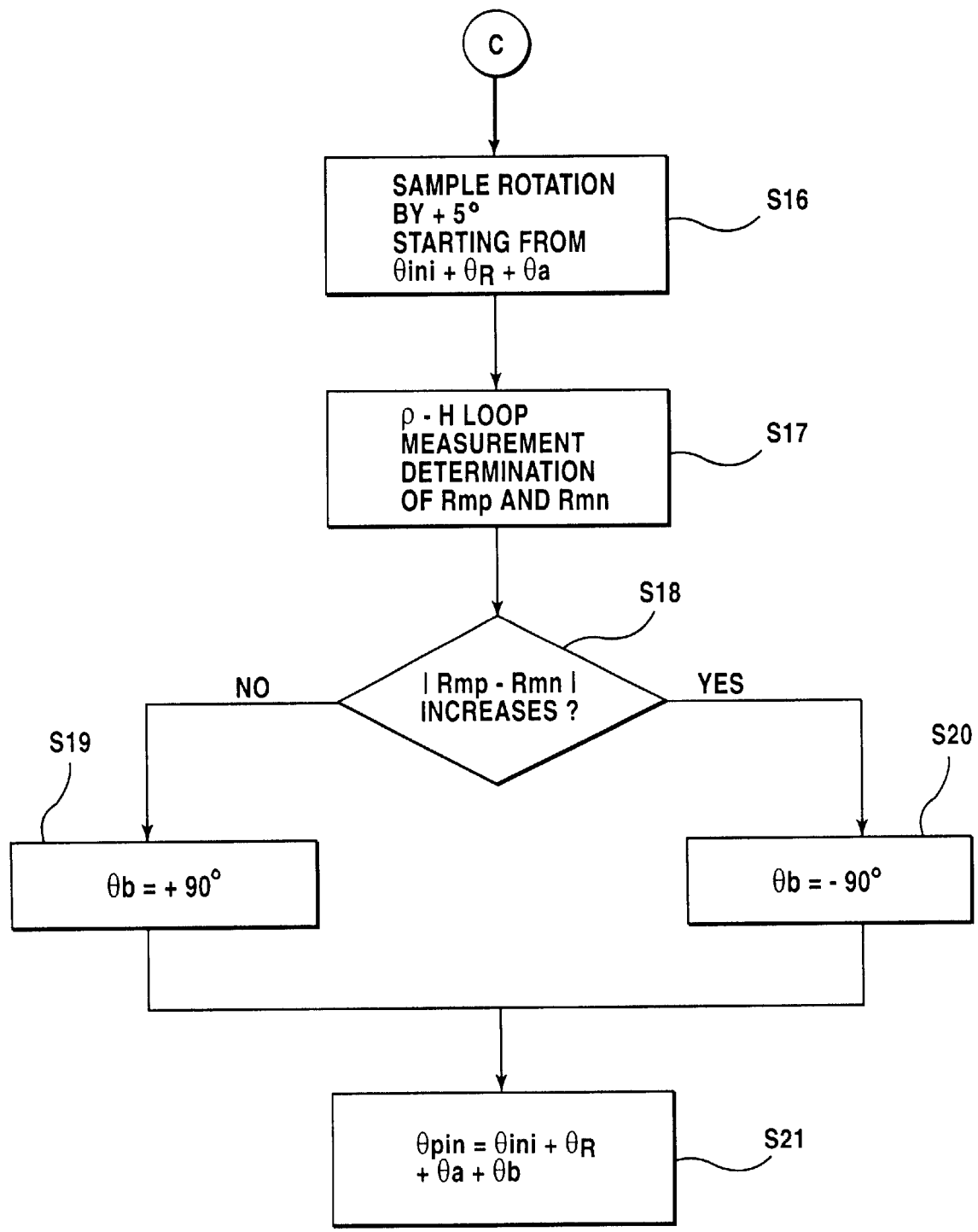

FIGS. 3a to 3c illustrate software program of the computer 22. Details of the measurement of the magnetization direction of the pinned layer will be described below.

At step S1 in FIG. 3a, the sample wafer 26 (hereinafter a wafer is used in the explanation) to be measured is placed on the platform 25. And at the same time the position alignment of the output pads of the spin valve stacked thin film structure to be measured on the sample wafer 26 and probe pins assembly 27 is done. For this process a well known technique of alignment by the X-Y-Z table 23 movement and the θ table 24 rotation, which are controlled by commanding the X-Y-Z table controller 28 and the θ table controller 29 is used.

Figure 4:
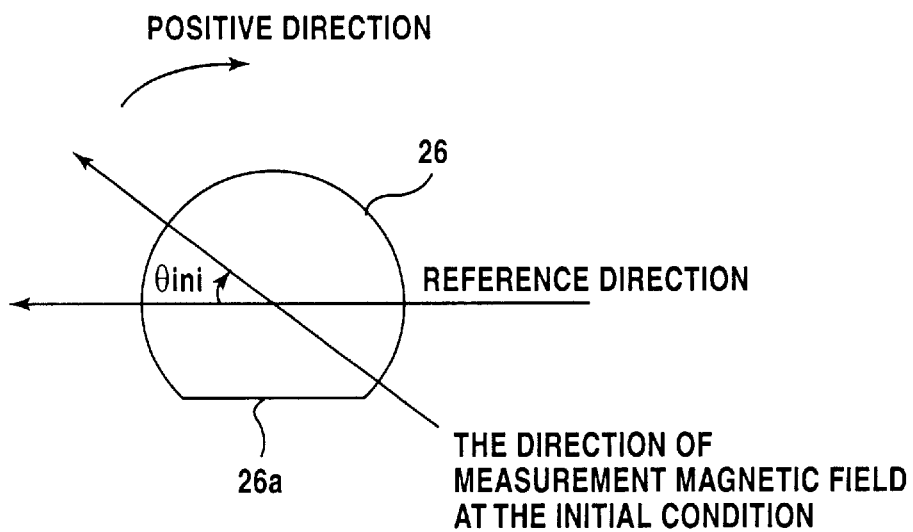
FIG. 4 shows the relation among the wafer orientation flat, the basis axis of the MR device and the direction of applied measurement magnetic field.

At next step S2 in FIG. 3a, a reference direction to measure the magnetization direction of the pinned layer is defined. The pinned direction θpin is ultimately expressed against the reference direction. This reference direction may be the direction of the wafer orientation flat when a wafer with such an orientation flat is used, or pin direction fixed by pin annealing process. In the embodiment of the present invention, the direction of the orientation flat is used as the reference direction (and defined as the basic axis direction of the MR device to be measured). The initial and not rotated direction of the externally applied measurement magnetic field is expressed by θini against the reference direction. The rotation angle is defined as positive toward clockwise direction starting from the reference direction. FIG. 4 illustrates relationship among a wafer orientation flat 26a of the sample wafer 26, the reference direction, and the initial direction of the externally applied measurement magnetic field. Also, at this step S2, an angle θR, which is described later, is reset to zero.

Figure 5:
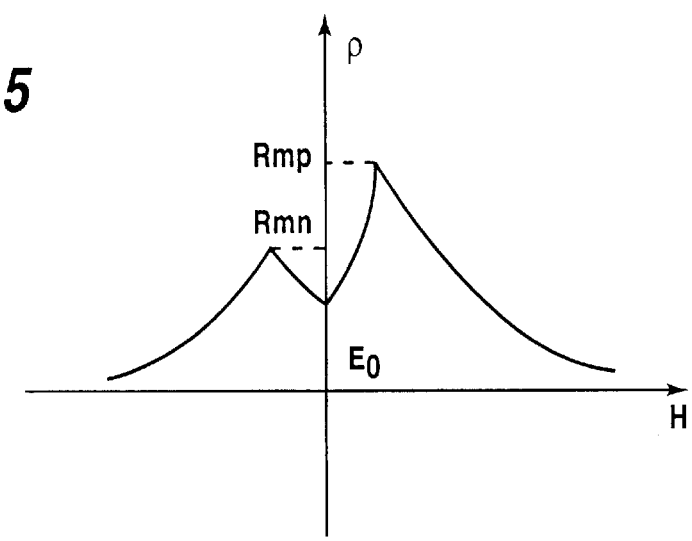
FIG. 5 shows the measured ρ-H loop characteristic and peak electrical resistance values Rmp and Rmn under positive and negative externally applied measurement magnetic fields respectively.

Then, at next step S3, the ρ-H loop is measured. The method of the measurement of ρ-H loop is well known and hence the details are omitted and simply described in this paragraph. The Helmholtz coil 20 generates a magnetic field whose polarity changes alternately and periodically like a sine waveform and it is enforced onto the sample wafer 26, sense current is supplied to the spin valve stacked thin film structure, and then the resistance between the output pads is measured and the ρ-H loop is obtained. The strength of the applied magnetic field is chosen to be almost doubled level of the anisotropy critical field strength Hua (more than about 1k Oe) of the pinned layer or more. Larger applied magnetic field strength is much better. At this step S3, the maximum electrical resistance value Rmp under the positive applied measurement magnetic field and another maximum electrical resistance value Rmn under the negative applied measurement magnetic field are determined by a peak detection method. To avoid detection error, the range of the applied measurement magnetic field, 0±5 Oe, is excluded. FIG. 5 illustrates the measured ρ-H loop characteristic and maximum electrical resistance values Rmp and Rmn under positive and negative externally applied measurement magnetic fields, respectively.

At following step S4, whether there exist a ρ-H loop which contains the maximum electrical resistance values in the both positive and negative direction of the externally applied measurement magnetic field or not is determined. When such a loop exists, then the measurement process goes to step S6, or otherwise goes to step S5. At step S5, the sample 26 is rotated by +90 degrees to set at θR=+90 degrees, then the process returns to the S3 and again ρ-H loop is measured. The rotation of the sample wafer 26 is done by sending a rotation command from the computer 22 to the θ table controller 29 and by driving the θ table 24.

At step S6, the sample wafer 26 is rotated by +5 degrees. Then the measurement process goes to step S7 where ρ-H loop is measured, and the maximum values Rmp and Rmn are calculated again.

At next step S8, an absolute difference between the obtained maximum values Rmp and Rmn at step S6 is compared with the absolute difference between the obtained maximum values Rmp and Rmn before the rotation of the sample wafer 26, namely with the absolute difference between the maximum values Rmp and Rmn obtained at step S3. This is done for finding the rotation direction which gives a definite decrease of the absolute difference between Rmp and Rmn.

When the difference value decreases, the rotation direction which gives decrease of the absolute difference between Rmp and Rmn is assumed positive, and the measurement process goes to step S9 in FIG. 3b. When the difference value increases, the rotation direction which gives decrease of the absolute difference between Rmp and Rmn is assumed negative, and the measurement process goes to step S22 in FIG. 3b.

At step S9, the sample wafer 26 is reversely rotated by 5 degrees (−5 degrees rotation) and reset to the condition (θini+θR), and then the sample wafer 26 is rotated by 1 degree toward the positive direction (+1 degree rotation). At next step S10, again ρ-H loop is measured, and the maximum values Rmp and Rmn are calculated.

At next step S11, the absolute difference between the obtained maximum values Rmp and Rmn at step S10 is compared with the absolute difference between the obtained maximum values Rmp and Rmn before the +1 degrees rotation of the sample wafer 26, namely with the absolute difference between the maximum values Rmp and Rmn obtained at step S3. This is done for checking if the absolute difference between Rmp and Rmn increases or decreases.

When the difference value decreases, the measurement process goes to step 12. When the value increases, the process goes to step S15 assuming Rmp and Rmn are almost same. At step S12, the sample wafer 26 is rotated by 1 degree toward the positive direction. Then, at step S13 again the ρ-H loop is measured, and the maximum values Rmp and Rmn are obtained.

At next step S14, the absolute difference between the maximum values Rmp and Rmn obtained at step S13 is compared with the absolute difference between the obtained maximum values Rmp and Rmn before the +1 degrees rotation of the sample wafer 26, namely with the absolute difference between the maximum values Rmp and Rmn obtained at step S10. This is done for checking whether the absolute difference between Rmp and Rmn increases or decreases.

When the difference value decreases, the measurement process returns to step S12. When the value increases, the process goes to step S15 assuming Rmp and Rmn are almost same. At this step S15, the accumulated value of the rotation angles of the sample wafer 26 started from the initial point (θini+θR) is expressed by θa. This angle θa measured from the initial point shows the position at which Rmp and Rmn become almost the same. This is based on the principle of ρ-H loop characteristic which becomes symmetrical when there is no change in pinned direction and becomes unsymmetrical when there is a definite change in the direction.

At following step S16 in FIG. 3c, the sample wafer 26 is rotated by +5 degrees started from the point (θini+θR+θa). Then, at step S17 again the ρ-H loop is measured, and the maximum values Rmp and Rmn are calculated.

At next step S18, the absolute difference between the maximum values Rmp and Rmn obtained at step S17 is compared with the absolute difference between the obtained maximum values Rmp and Rmn before the +5 degrees rotation of the sample wafer 26. This is done for checking whether the absolute difference between Rmp and Rmn increases or decreases.

When the difference value decreases, the measurement process goes to step 19, and when the value increases, the process goes to step 20. At step S19, the pinned direction is assumed to be in the side of the positive applied measurement magnetic field +H, and θb is defined as θb=+90 degrees. on the other hand at step S20, the pinned direction is assumed to be in the side of the negative externally applied measurement magnetic field −H, and θb is defined as θb=−90 degrees. When Rmp and Rmn are almost same, the angle between the magnetization direction of the pinned layer and the direction of the positive externally applied measurement magnetic field, θb, is +90 or −90 degrees. In order to determine the angle θb value, the characteristic of the ρ-H loop, in which Rmp decreases and Rmn increases when the magnetization direction of the pinned layer is rotated toward the direction +H, is applied.

Figure 6:
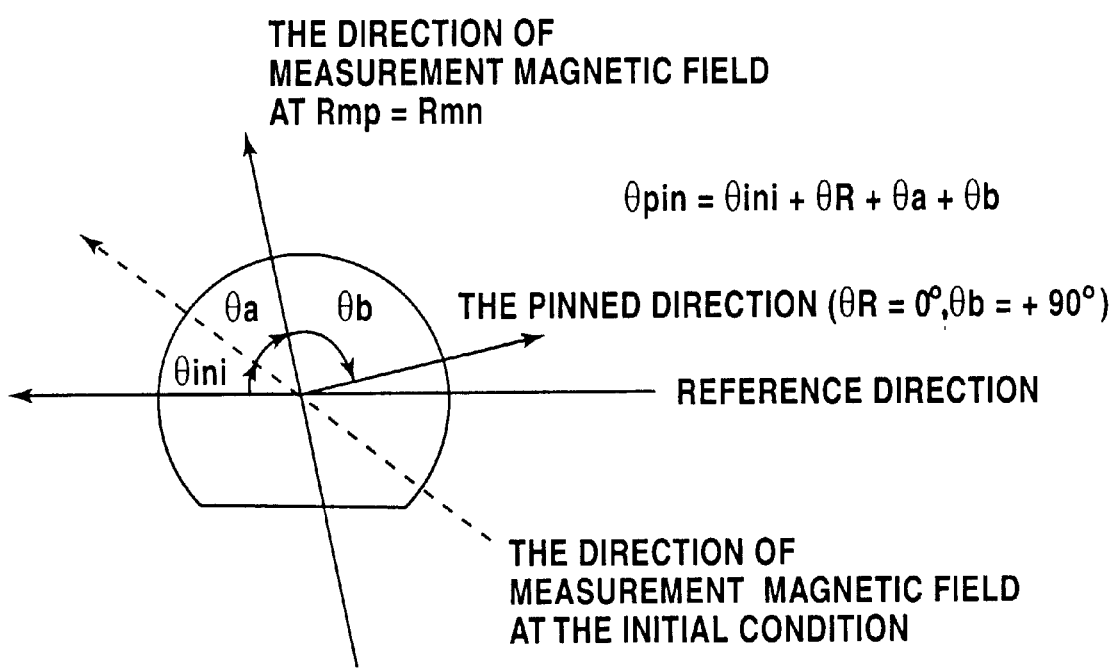
FIG. 6 shows the relation among the angles, θpin, θini, θa and θb in the measurement method in the embodiment of the present invention.

At following step S21, the angle of the magnetization direction of the pinned layer against the reference direction, θpin, is calculated by θpin=θini+θR+θa+θb using the determined values of θini, θR, θa and θb. FIG. 6 illustrates relationship among the angles, θini, θR, θa and θb in the measurement method according to the present invention. In FIG. 6, the relation is illustrated by not rotating the sample wafer 26 but rotating the direction of the externally applied measurement magnetic field for easier understanding. Also, FIG. 6 assumes θR=0 and θb=+90 degrees.

On the other hand at step S22 in FIG. 3b, the sample wafer 26 is reversely rotated by 5 degrees (−5 degrees rotation) and reset to the condition (θini+θR), and then the sample wafer 26 is rotated by 1 degree toward the negative direction (−1 degree rotation). At step S23 again the ρ-H loop is measured, and the maximum values Rmp and Rmn are obtained.

At next step S24, the absolute difference between the maxi mum values Rmp and Rmn obtained at step S23 is compared with the absolute difference between the obtained maximum values Rmp and Rmn before the −1 degrees rotation of the sample wafer 26, namely with the absolute difference between the maximum values Rmp and Rmn obtained at step S3. This is done for checking whether the absolute difference between Rmp and Rmn increases or decreases.

When the difference value decreases, the measurement process goes to step 25. When the value increases, the process goes to step S28 assuming Rmp and Rmn are almost the same. At step S25, the sample wafer 26 is rotated by 1 degree toward the negative direction (−1 degree). Also, at step S26 again the ρ-H loop is measured, and the maximum values Rmp and Rmn are obtained.

At next step S27, the absolute difference between the maximum values Rmp and Rmn obtained at step S26 is compared with the absolute difference between the obtained maximum values Rmp and Rmn before the −1 degrees rotation of the sample wafer 26. This done is for checking whether the absolute difference between Rmp and Rmn increases or decreases.

When the difference value decreases, the measurement process returns to step S25. When the value increases, the process goes to step S28 assuming Rmp and Rmn are almost same. At this step S28, the accumulated value of the rotation angles of the sample wafer 26 started from the initial point (θini+θR) is expressed by θa. This angle θa measured from the initial point shows the position at which Rmp and Rmn become almost the same. This is based on the principle of the ρ-H loop characteristic which becomes symmetrical when there is no change in pinned direction and becomes unsymmetrical when there is a definite change in the direction.

Then, the previously described steps, S16 through S21 shown in FIG. 3c, are proceeded to determine the pinned direction θpin.

Here another embodiment of the present invention is described. In this embodiment, only the computer program is different and the configuration of the measurement apparatus is just same as shown in FIG. 2. In the following description, the same reference numbers in FIG. 2 are used.

Figure 7A:
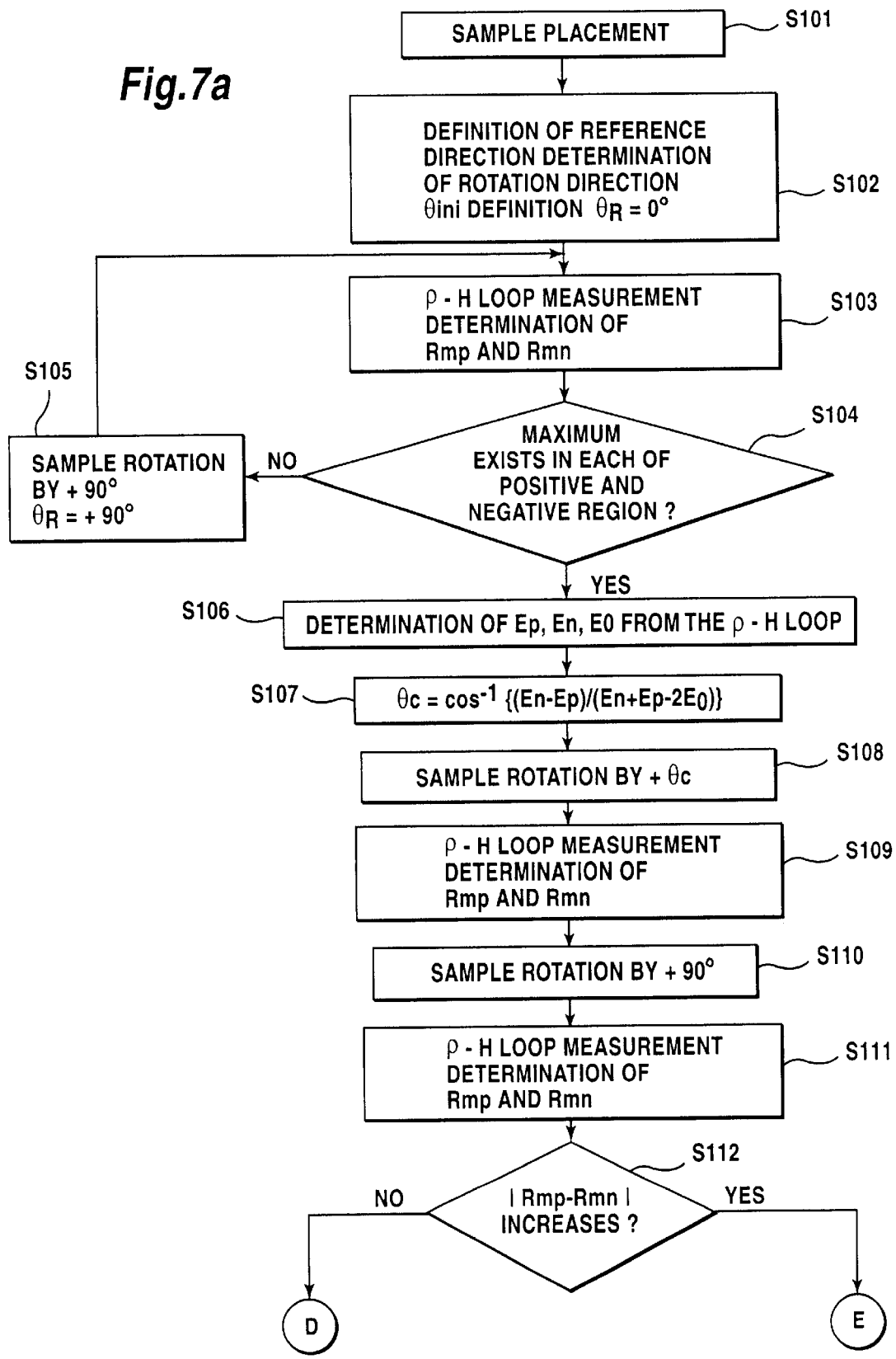
FIGS. 7a to 7c show flow charts of parts of the computer program in another embodiment of the present invention in FIG. 2.
Figure 7B:
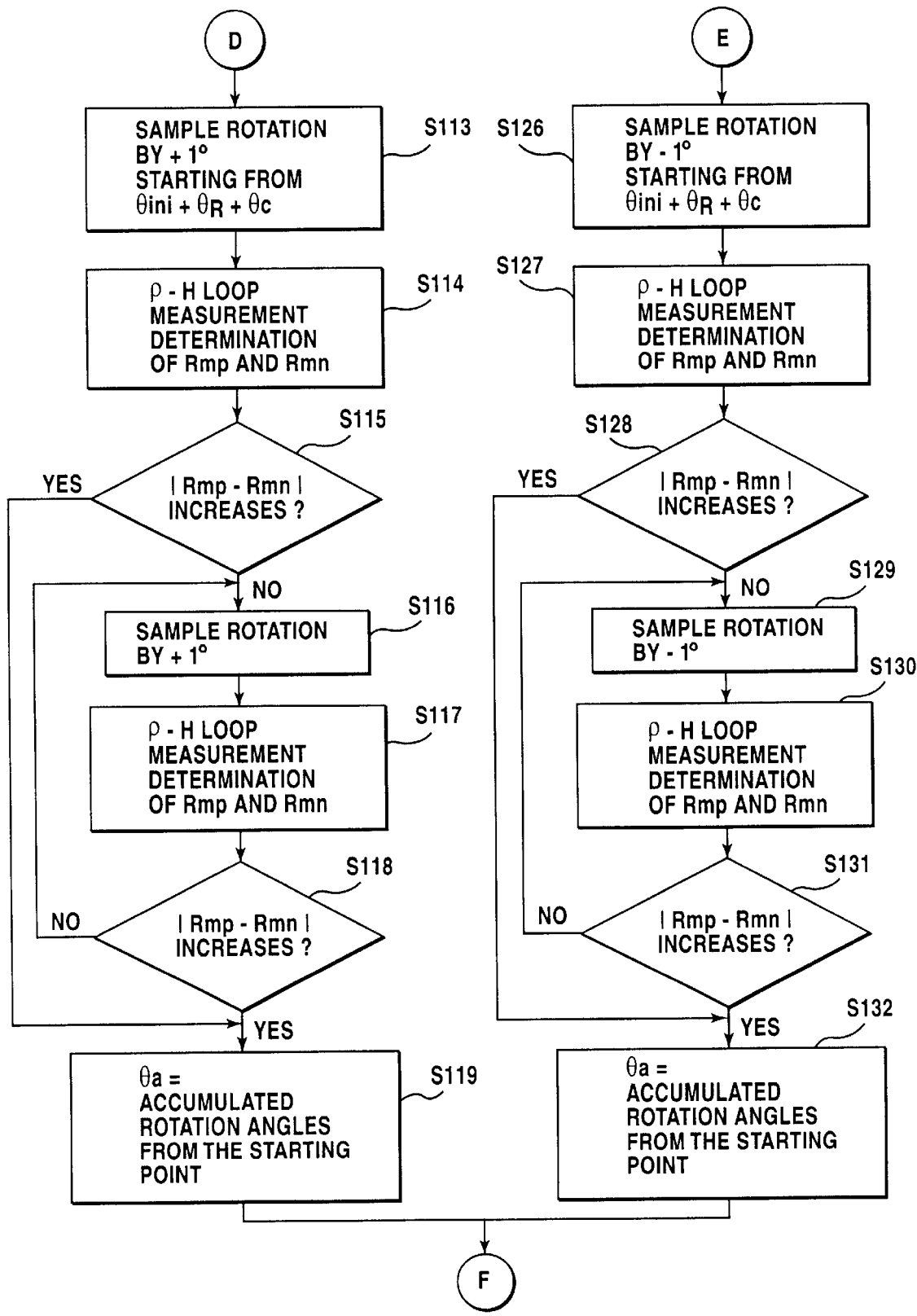
Figure 7C:
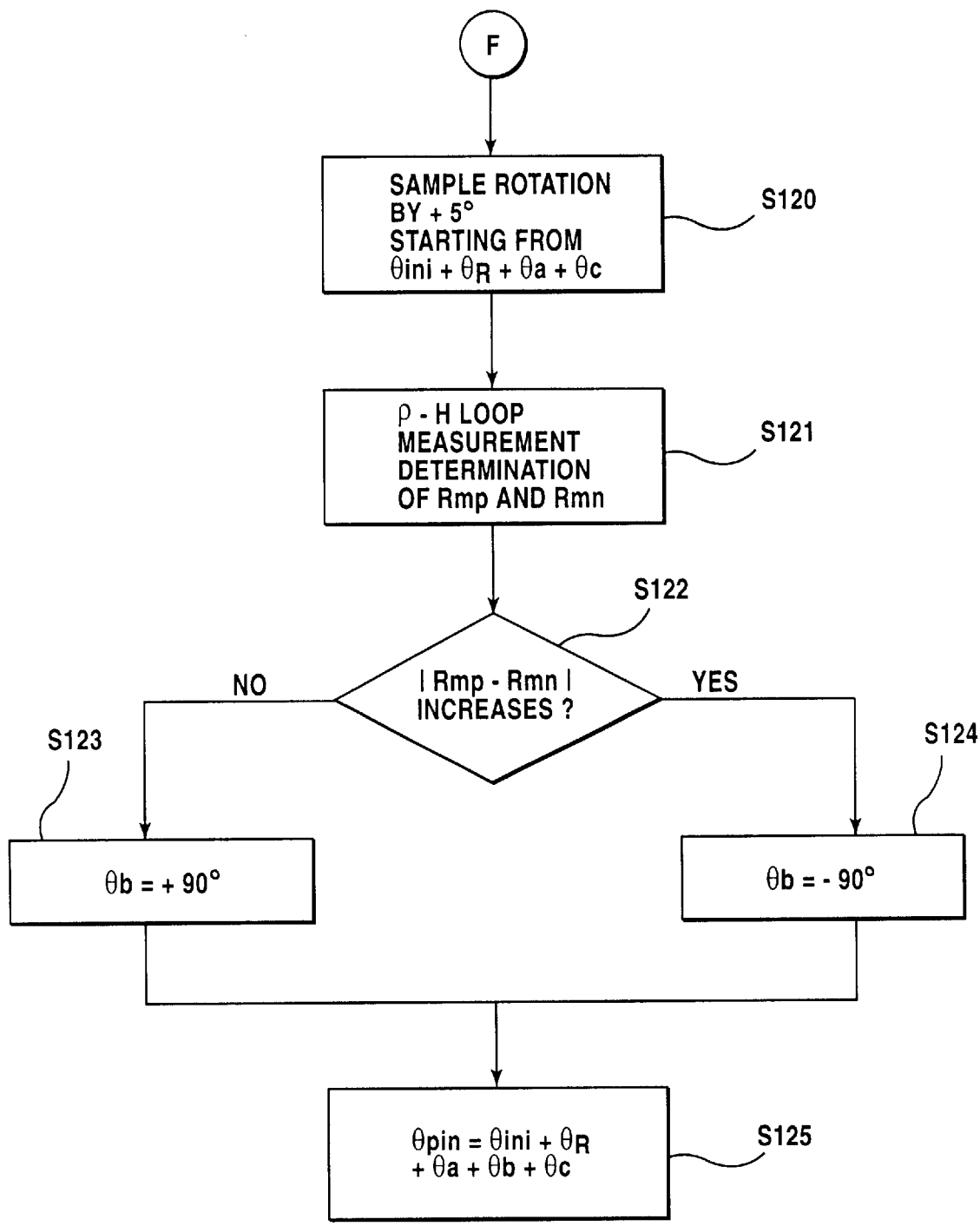

FIGS. 7a to 7c illustrate the software program of the computer 22, and the details of the measurement of the magnetization direction of the pinned layer is described below.

At step S101 in FIG. 7a, the sample wafer 26 to be measured is placed on the platform 25. And at the same time the position alignment of the output pads of the spin valve stacked thin film structure to be measured on the sample wafer 26 and probe pins assembly 27 is done. For this process a well known technique of alignment by the X-Y-Z table 23 movement and the θ table 24 rotation which are controlled by commanding the X-Y-Z table controller 28 and the θ table controller 29 is used.

At following step S102 in FIG. 7a, a reference direction to measure the magnetization direction of the pinned layer is defined. The pinned direction θpin is ultimately expressed against the reference direction. This reference direction may be the direction of the wafer orientation flat when a wafer with such an orientation flat is used, or pin direction fixed by pin annealing process. In the embodiment of the present invention, the direction of the orientation flat is used as the reference direction (and defined as the basic axis direction of the MR device to be measured). The initial and not rotated direction of the externally applied measurement magnetic field is expressed by θini against the reference direction. The rotation angle is defined as positive toward clockwise direction starting from the basis. And at this step S102, an angle θR, which is described later, is reset to zero.

At next step S103, the ρ-H loop is to be measured. The method of the measurement of ρ-H loop is well known and hence the details are omitted and simply described in this paragraph. The Helmholtz coil 20 generates a magnetic field whose polarity changes alternately and periodically like a sine waveform and it is enforced onto the sample wafer 26, sense current is supplied to the spin valve stacked thin film structure, and then the resistance between the output pads is measured and the ρ-H loop is obtained. The strength of the applied magnetic field is chosen to be almost doubled level of the anisotropy critical field strength Hua (more than 1k Oe) or more. Larger field strength is much better. At this step S103, the maximum electrical resistance value Rmp under the positive applied measurement magnetic field and another maximum electrical resistance value Rmn under the negative applied measurement magnetic field are obtained by a peak detection method. To avoid detection error, the range of the applied measurement magnetic field, 0 ± 5 Oe, is excluded.

At next step S104, whether there exists a ρ-H loop which contains the maximum electrical resistance values in the both positive and negative direction of the externally applied measurement magnetic field or not is obtained. When such a loop exists, then the measurement process goes to step S106, or otherwise goes to step S105. At step S105, the sample 26 is rotated by +90 degrees, and setting of θR=+90 is done, then the process returns to step S103 and again the ρ-H loop is measured. The rotation of the sample wafer 26 is done by sending a rotation command from the computer 22 to the θ table controller 29 and driving the θ table 24.

Figure 8:
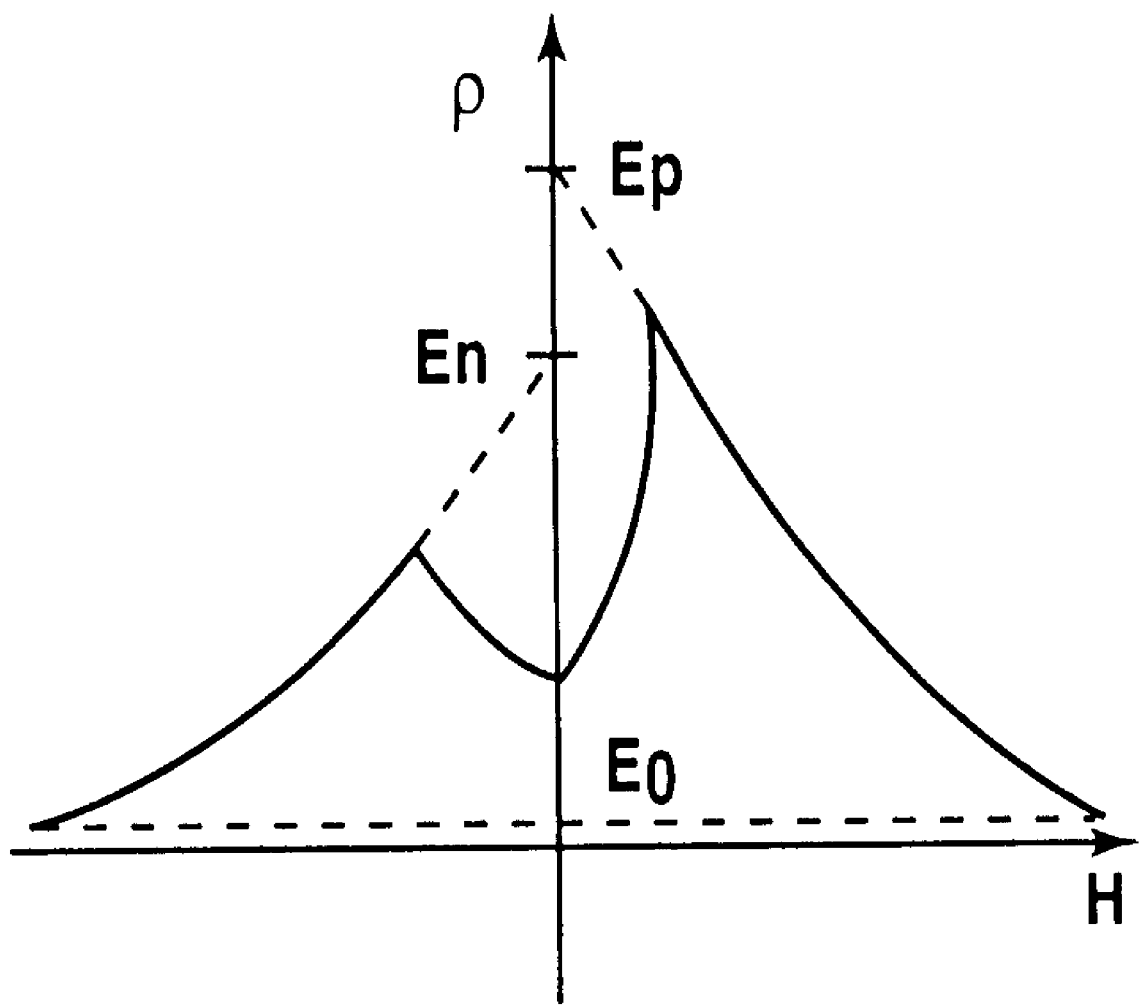
FIG. 8 shows the definitions of Ep, En and E0 in the ρH loop.

At step S106, the values Ep, En and E0 are determined based on the measured ρ-H loop at step S103. As shown in FIG. 8, Ep is determined by extrapolating the partial curve of the ρ-H loop in the positive region of field strength larger than the point which gives the peak electrical resistance Rmp and finding the intersection point with the axis H=0, and En is determined by extrapolating the partial curve of the ρ-H loop in the negative region of field strength less than the point which gives the peak electrical resistance Rmn and finding the intersection point with the axis H=0, E0 is determined by measuring the electrical resistance under positive or negative magnetic field strength of almost doubled Hua. Thus, Ep indicates a rough value of the electrical resistance of MR element when the externally applied magnetic field is 0 and the free layer magnetization is +H direction. Similar to this, En indicates a rough value of the electrical resistance of MR element when the externally applied magnetic field is 0 and the free layer magnetization is −H direction, and therefore E0 is almost equal to β that is the resistance E when the free and pinned layer magnetizations are in parallel.

It is well known in the art that according the principal of GMR (spin value effect) that the electrical resistance E of GMR can be given by the equation:

$$E=\alpha(1-\cos\theta)/2+\beta$$

where θ is the angle between the free and pinned layer magnetizations, β is the resistance E when the free and pinned layer magnetizations are in parallel (when θ=0 degree), and α is the value obtained by subtracting β from the resistance E when the free and pinned layer magnetizations are in anti-parallel (when θ=180 degrees). The value α corresponds to the maximum resistance change of GMR.

From the aforementioned equation, En and Ep are obtained as:

$$En=\alpha(1-\cos\theta c)/2+\beta$$

$$Ep=\alpha(1-\cos(180-\theta c))/2+\beta=\alpha(1+\cos(\theta c))/2+\beta$$

where θc is an approximate angle between the pinned direction and the direction of the externally applied measurement magnetic field.

Thus, En−Ep can be obtained as:

$$En-Ep = \alpha \cos\theta c,$$

and therefore $$\theta c = \cos^{-1}((En-Ep)/\alpha).$$

On the other hand, En+Ep can be obtained as:

$$En+Ep = \alpha/2 - (\cos\theta c)/2 + \beta + \alpha/2 + (\cos\theta c)/2 + \beta = \alpha + 2\beta,\text{ and therefore}$$

$$\alpha = En+Ep-2\beta = En+Ep-2E0.$$

By substituting α to the above equation, θc can be obtained as:

$$\Theta c = \cos^{-1}((En-Ep)/(En+Ep-2E0)).$$

As will be understood from the above-description, the equation of $\theta c = \cos^{-1}((En-Ep)/(En+Ep-2E0))$ can be derived from the principal of GMR, where Ep and En are the MR resistance when the externally applied magnetic field is zero and the free layer magnetization is +H and −H directions, and E0 is the MR resistance almost equal to β that is the resistance E when the free and pinned layer magnetizations are in parallel.

At following step S107, θc is calculated by the equation $\theta c = \cos^{-1}\{(En-Ep)/(En+Ep-2E0)\}$. At this phase, θini+θR+θc and/or θini+θR−θc gives an approximate value of the pinned direction. At next step S108, the sample wafer is rotated by +θc. Then the pinned direction and the direction of the externally applied measurement magnetic field became orthogonal each other. At the early phase of the measurement process, only one time of the measurement of the ρ-H loop gives an approximate pinned direction. Based on the approximate value, by implementing the following processes described below the measurement time can be greatly reduced and test efficiency is so much improved.

At next step S109, the ρ-H loop is measured, and the maximum values Rmp and Rmn are obtained. And, at following step S110, the sample wafer 26 is rotated by +5 degrees, and at step Slll again the ρ-H loop is measured, and the maximum values Rmp and Rmn are obtained.

At following step S112, the absolute difference between the maximum values Rmp and Rmn obtained at step S111 is compared with the absolute difference between the obtained maximum values Rmp and Rmn before the +5 degrees rotation of the sample wafer 26, namely with the absolute difference between the maximum values Rmp and Rmn obtained at step S109. This is done for checking the rotation direction that gives a definite decrease of the absolute difference between Rmp and Rmn.

When the difference value decreases, the rotation direction which gives decrease of the absolute difference between Rmp and Rmn is assumed positive, and the measurement process goes to step S113 in FIG. 7b. When the difference value increases, the rotation direction which gives decrease of the absolute difference between Rmp and Rmn is assumed negative, and the measurement process goes to step S126 in FIG. 7b.

At step S113 in FIG. 7b, the sample wafer 26 is reversely rotated by 5 degrees (−5 degrees rotation) and reset to the condition (θini+θR+θc), and then the sample wafer 26 is rotated by 1 degree toward the positive direction (+1 degree rotation). And at step S114 again the ρ-H loop is measured, and the maximum values Rmp and Rmn are obtained.

At following step S115, the absolute difference between the maximum values Rnp and Rmn obtained at step S114 is compared with the absolute difference between the obtained maximum values Rmp and Rmn before the +1 degrees rotation of the sample wafer 26, namely with the absolute difference between the maximum values Rmp and Rmn obtained at step S109. This is done for checking if the absolute difference between Rmp and Rmn increases or decreases.

When the difference value decreases, the measurement process goes to step 116. When the value increases, the process goes to step S119 assuming Rmp and Rmn are almost the same. At step S116, the sample wafer 26 is rotated by 1 degree toward the positive direction. And at step S117 again the ρ-H loop is measured, and the maximum values Rmp and Rmn are obtained.

At next step S118, the absolute difference between the maximum values Rmp and Rmn obtained at step S117 is compared with the absolute difference between the obtained maximum values Rmp and Rmn before the +1 degrees rotation of the sample wafer 26. This is done for checking if the absolute difference between Rmp and Rmn increases or decreases.

When the difference value decreases, the measurement process returns to step S116. When the value increases, the process goes to step S119 assuming Rmp and Rmn are almost same. At this step S119, the accumulated value of the rotation angles of the sample wafer 26 started from the initial point (θini+θR+θc) is expressed by θa. This angle θa measured from the initial point shows the position at which Rmp and Rmn become almost the same. This is based on the principle of the ρ-H loop characteristic which becomes symmetrical when there is no change in pinned direction and becomes unsymmetrical when there is a definite change in the direction.

At following step S120 in FIG. 7c, the sample wafer 26 is rotated by +5 degrees started from the point (θini+θR+θc+θa). Then, at step S121 again the ρ-H loop is measured, and the maximum values Rmp and Rmn are obtained.

At next step S122, the absolute difference between the maximum values Rmp and Rmn obtained at step S121 is compared with the absolute difference between the obtained maximum values Rmp and Rmn before the +5 degrees rotation of the sample wafer 26. This is done for checking if the absolute difference between Rmp and Rmn increases or decreases.

When the difference value decreases, the measurement process goes to step 123, and when the value increases, the process goes to step 124. At step S123, the pinned direction is assumed to be in the side of the positive externally applied measurement magnetic field +H, and θb is defined as θb=+90 degrees. On the other hand at step S124, the pinned direction is assumed to be in the side of the negative externally applied measurement magnetic field −H, and θb is defined as θb=−90 degrees. When Rmp and Rmn are almost same, the angle between the magnetization direction of the pinned layer and the direction of the positive externally applied measurement magnetic field, θb, is +90 or −90 degrees. In order to determine the angle θb value, the characteristic of the ρ-H loop, in which Rmp decreases and Rmn increases when the magnetization direction of the pinned layer is rotated toward the direction +H, is applied.

At following step S125, the angle of the magnetization direction of the pinned layer against the reference direction, θpin, is calculated by θpin=θini+θR+θa+θb+θc using the determined values of θini, θR, θa, θb and θc.

On the other hand at step S126 in FIG. 7b, the sample wafer 26 is reversely rotated by 5 degrees (−5 degrees rotation) and reset to the condition (θini+θR+θc), and then the sample wafer 26 is rotated by 1 degree toward the negative direction (−1 degree rotation). And at step S127 again the ρ-H loop is measured, and the maximum values Rmp and Rmn are obtained.

At next step S128, the absolute difference between the values Rmp and Rmn obtained at step S127 is compared with the absolute difference between the obtained maximum values Rmp and Rmn before the −1 degree rotation of the sample wafer 26, namely with the absolute difference between the maximum values Rmp and Rmn obtained at step S109. This is done for checking if the absolute difference between Rmp and Rmn increases or decreases.

When the difference value decreases, the measurement process goes to step S129. When the value increases, the process goes to step S132 assuming Rmp and Rmn are almost the same. At step S129, the sample wafer 26 is rotated by 1 degree toward the negative direction (−1 degree). And at step S130 again the ρ-H loop is measred, and the maximum values Rmp and Rmn are obtained.

At next step S131, the absolute difference between the maximum values Rmp and Rmn obtained at step S130 is compared with the absolute difference between the obtained maximum values Rmp and Rmn before the −1 degree rotation of the sample wafer 26. This is done for checking if the absolute difference between Rmp and Rmn increases or decreases.

When the difference value decreases, the measurement process returns to step S129. When the value increases, the process goes to step S132 assuming Rmp and Rmn are almost the same. At this step S132, the accumulated value of the rotation angles of the sample wafer 26 started from the initial point ($\theta ini+\theta R+\theta c$) is expressed by $\theta a$. This angle $\theta a$ measured from the initial point shows the position at which Rmp and Rmn become almost the same. This is based on the principle of the ρ-H loop characteristic which becomes symmetrical when there is no change in pinned direction and becomes unsymmetrical when there is a definite change in the direction.

Then the previously described steps, S120 through S125 shown in FIG. 7c, are proceeded to determine the pinned direction $\theta pin$.

In the embodiment of the present invention described in the previous paragraphs, the sample wafer 26 is rotated. Also another way of rotating the direction of the measurement magnetic field can be applied for the measurement. The angular step used in the determination of the rotation angle, at which Rmp and Rmn become almost same, is not limited to 1 degree. It can be arbitrarily chosen. The angular steps used in the determination of the rotation direction, along which the absolute difference between Rmp and Rmn decreases, and used in the determination of the angles $\theta R$ and $\theta b$ are not limited to 5 degrees. They can be also arbitrarily chosen.

The present invention can be applied not only to the spin valve effect MR device of a spin valve stacked thin film structure used in the explanation of the embodiment but also to all the MR devices like a TMR device biased by anti-ferromagnetic material.

While the principles of the present invention have been described above in connection with specific embodiments, and particular modification thereof, it is to be clearly understood that this description is made only by way of example and not as a limitation on the scope of invention.

According to the present invention, the magnetization direction of the pinned layer of a MR device biased by anti-ferromagnetic material like a spin valve effect MR read sensor device is determined by measuring the relative angle between the basis axis of the MR device and the direction of applied measurement magnetic field which is rotated until both the maximum electrical resistance values under positive and negative applied measurement magnetic field onto the MR device become almost the same. This method is based on next relation expressed by the equation, $R=(1-\cos\theta p)/2$, where R is the electrical resistance of the spin valve effect MR device and $\theta p$ is the angle between the magnetization direction of the pinned layer and that of the free layer. By this way, the magnetization direction of the pinned layer of a spin valve effect MR device can be precisely measured. Using the measurement apparatus based on the method, the relations between the pin annealing condition and the thermal stability of the magnetization direction of the pinned layer are well understood in the development of MR devices biased with anti-ferromagnetic materials. And installing the measurement apparatuses in the manufacturing line of spin valve effect MR devices, the product testing, the quality assurance and quality control can be very effectively done.

Many widely different embodiments of the present invention may be constructed without departing from the spirit and scope of the present invention. It should be understood that the present invention is not limited to the specific embodiments described in the specification, except as defined in the appended claims.

What is claimed is:

1. A method of measuring magnetization direction of a magnetoresistive effect device, comprising:

a first step of obtaining both maximum electrical resistance values under positive and negative applied measurement magnetic fields onto the magnetoresistive effect device biased by antiferromagnetic material;

a second step of relatively rotating a basic axis of said magnetoresistive effect device against a direction of said applied measurement magnetic field until both said maximum resistance values become comparatively the same; and a third step of obtaining a relative rotation angle between the basic axis of said magnetoresistive effect device and the direction of said applied measurement magnetic field, wherein said second step includes a step of relatively rotating the basic axis of said magnetoresistive effect device against the direction of said applied measurement magnetic field by specified degrees toward a direction in which the absolute difference between the maximum electrical resistance value Rmp under the positive applied measurement magnetic field and another maximum electrical resistance value Rmn under the negative applied measurement magnetic field decreases, and a step of obtaining said maximum values of Rmp and Rmn after the rotation.

2. The method as claimed in claim 1, wherein said first step includes a step of measuring ρ-H loop of said magnetoresistive effect device and a step of obtaining both the maximum electrical resistance values under positive and negative applied measurement magnetic fields onto said magnetoresistive effect device depending upon the measured ρ-H loop.

3. The method as claimed in claim 1, wherein said second step further includes a step of detecting the direction of the rotation for decreasing said absolute difference between said maximum values Rmp and Rmn.

4. The method as claimed in claim 1, wherein said third step includes a step of detecting the polarity of said magnetization direction of said magnetoresistive effect device against the direction of said applied measurement magnetic field, and a step of adding +90 degrees or −90 degrees depending upon the result of the polarity.

5. The method as claimed in claim 4, wherein expressing the positive direction of the externally applied measurement magnetic field against the basic axis of said magnetoresistive effect device by θini, the relative rotation angle obtained by said third step by θa, the added angle of +90 degrees or −90 degrees depending upon said result of the polarity by θb, then said magnetization direction θpin is given by an equation of θpin=θini+θa+θb.

6. The method as claimed in claim 1, wherein said method further comprises a step of judging whether said maximum electrical resistance value of said magnetoresistive effect device exists in both the positive and negative direction of said applied measurement magnetic fields or not, and a step of relatively rotating the basic axis of said magnetoresistive effect device against the direction of said applied measurement field by 90 degrees when said maximum values are not observed.

7. An apparatus for measuring magnetization direction of a magnetoresistive effect device, comprising:
  maximum value detection means for obtaining both maximum electrical resistance values under positive and negative applied measurement magnetic fields onto said magnetoresistive effect device biased by antiferromagnetic material;
  rotation control means for relatively rotating a basic axis of said magnetoresistive effect device against a direction of said applied measurement magnetic field until both said maximum resistance values become comparatively the same; and
  angle detection means for obtaining a relative rotation angle between the basic axis of said magnetoresistive effect device and the direction of said applied measurement magnetic field,
    wherein said rotation control means includes means for relatively rotating the basic axis of said magnetoresistive effect device against the direction of said applied measurement magnetic field by specified degrees toward a direction in which the absolute difference between the maximum electrical resistance value Rmp under the positive applied measurement magnetic field and another maximum electrical resistance value Rmn under the negative applied measurement magnetic field decreases, and means for obtaining said maximum values of Rmp and Rmn after the rotation.

8. The apparatus as claimed in claim 7, wherein said maximum value detection means includes means for measuring ρ-H loop of said magnetoresistive effect device and means for obtaining both the maximum electrical resistance values under positive and negative applied measurement magnetic fields onto said magnetoresistive effect device depending upon the measured ρ-H loop.

9. The apparatus as claimed in claim 7, wherein said rotation control means further includes means for detecting the direction of the rotation for decreasing said absolute difference between said maximum values Rmp and Rmn.

10. The apparatus as claimed in claim 7, wherein said angle detection means includes means for detecting the polarity of said magnetization direction of said magnetoresistive effect device against the direction of said applied measurement magnetic field, and means for adding +90 degrees or −90 degrees depending upon the result of the polarity.

11. The apparatus as claimed in claim 10, wherein expressing the positive direction of the externally applied measurement magnetic field against the basic axis of said magnetoresistive effect device by θini, the relative rotation angle obtained by said third step by θa, the added angle of +90 degrees or −90 degrees depending upon said result of the polarity by θb, then said magnetization direction θpin is given by an equation of θpin=θini+θa+θb.

12. The apparatus as claimed in claim 7, wherein said apparatus further comprises means for judging whether said maximum electrical resistance value of said magnetoresistive effect device exists in both the positive and negative direction of said applied measurement magnetic fields or not, and means for relatively rotating the basic axis of said magnetoresistive effect device against the direction of said applied measurement field by 90 degrees when said maximum values are not observed.

* * * * *

UNITED STATES PATENT AND TRADEMARK OFFICE
CERTIFICATE OF CORRECTION

PATENT NO. : 6,294,911 B1
DATED : September 25, 2001
INVENTOR(S) : Shimizawa et al.

It is certified that error appears in the above-identified patent and that said Letters Patent is hereby corrected as shown below:

<u>Title page,</u>
Item [54], Title of Invention, Please change the following: "MEASUREMENT METHOD OF MAGETIZATION DIRECTION OF MAGNETORESISTIVE EFFECT DEVICES AND MEASUREMENT APPARATUS BASED ON THE METHOD OF TDK CORPORATION" to -- MEASUREMENT METHOD OF MAGETIZATION DIRECTION OF MAGNETORESISTIVE EFFECT DEVICES AND MEASUREMENT APPARATUS BASED ON THE METHOD --

Signed and Sealed this

Twenty-sixth Day of March, 2002

*Attest:*

*Attesting Officer*

JAMES E. ROGAN
*Director of the United States Patent and Trademark Office*